United States Patent
Ho et al.

(10) Patent No.: US 7,235,429 B2
(45) Date of Patent: *Jun. 26, 2007

(54) CONDUCTIVE BLOCK MOUNTING PROCESS FOR ELECTRICAL CONNECTION

(75) Inventors: Kwun-Yao Ho, Hsin-Tien (TW); Moriss Kung, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 336 days.

This patent is subject to a terminal disclaimer.

(21) Appl. No.: 10/927,989

(22) Filed: Aug. 26, 2004

(65) Prior Publication Data

US 2005/0026330 A1 Feb. 3, 2005

Related U.S. Application Data

(63) Continuation-in-part of application No. 10/605,305, filed on Sep. 22, 2003, now Pat. No. 6,916,687.

(30) Foreign Application Priority Data

May 28, 2003 (TW) ................................ 92114347 A

(51) Int. Cl.
*H01L 21/50* (2006.01)

(52) U.S. Cl. ............................... 438/120; 257/E21.506; 257/E21.508

(58) Field of Classification Search ................ 438/106, 438/108, 110, 112, 118, 119, 120, 127
See application file for complete search history.

(56) References Cited

U.S. PATENT DOCUMENTS

| 6,268,275 | B1 * | 7/2001 | Cobbley et al. ............ 438/612 |
| 6,916,687 | B2 * | 7/2005 | Ho et al. ..................... 438/120 |
| 7,045,389 | B1 * | 5/2006 | Tatsumi et al. ............. 438/108 |

* cited by examiner

*Primary Examiner*—Scott B. Geyer
(74) *Attorney, Agent, or Firm*—J. C. Patents

(57) ABSTRACT

A process for mounting conductive blocks on a surface of a substrate is disclosed wherein the substrate may be an IC chip, carrier, or a PCB. An adhesive layer is formed on each of the pads of the substrate. Thereafter, a plurality of conductive blocks are scattered on the surface of the substrate. The conductive blocks are vibrated such that only one of the conductive blocks is attached to the adhesive layer of each pad. After removing the un-attached conductive blocks from the surface of the substrate, and the remaining conductive blocks become the conductive blocks for electrical connection.

21 Claims, 4 Drawing Sheets

CONDUCTIVE BLOCK MOUNTING PROCESS FOR ELECTRICAL CONNECTION

CROSS-REFERENCE TO RELATED APPLICATION

This application is a continuation-in-part of a prior application Ser. No. 10/605,305, filed Sep. 22, 2003 now U.S. Pat. No. 6,916,687. The prior application Ser. No. 10/605,305 claims the priority benefit of Taiwan application serial no. 92114347, filed on May 28, 2003.

BACKGROUND OF THE INVENTION

1. Field of the Invention

The present invention generally relates to a process for mounting conductive blocks. More particularly, the present invention relates to a process for mounting conductive blocks on a substrate for electrical connection.

2. Description of the Related Art

Flip chip interconnection technology is a technique for connecting an IC chip to a carrier. Before the connection, a chip with a surface having an array of pads thereon is provided. Thereafter, bumps are formed respectively on the pads of the chip. The chip is flipped over and bonded with the carrier such that the pads of the chip are electrically and structurally connected to the contacts of the carrier via the bumps. Through circuits embedded within the carrier, the chip is able to communicate electrically with an external device. Since flip chip interconnection technology is able to produce a flip chip package with a high pin count, a small package area and a short transmission path, flip chip bonding processes are widely adopted in the fabrication of high grade chip packages.

In addition, ball grid array (BGA) interconnection technology is also widely used in the field of chip package. In a typical BGA package, a carrier electrically connects to a printed circuit board (PCB) through a plurality of conductive balls wherein the balls are deposited between the carrier and the PCB in an area array. In a conventional process of BGA package, BGA balls are mounted on a surface of the carrier, and then the carrier is mounted on the PCB with the BGA balls by surface mount technology (SMT).

Whether flip chip interconnection technology or BGA interconnection technology is applied, the conductive blocks, such as flip-chip bumps or BGA balls, are arranged in an area array and deposited between two substrates. The two substrates may be a chip and a relative carrier, a carrier and a relative PCB, or even a chip and a relative PCB.

SUMMARY OF THE INVENTION

Accordingly, one object of the present invention is to provide a process of mounting a conductive blocks on a surface of a substrate.

To achieve these and other advantages and in accordance with the purpose of the invention, as embodied and broadly described herein, the invention provides a process of mounting a plurality of conductive blocks on a surface of a substrate. The substrate has at a plurality of pads on the surface thereof. First, an adhesive layer is formed over each of the pads on the surface of the substrate. Thereafter, a plurality of conductive blocks are scattered on the surface of the substrate. The conductive blocks are vibrated such that only one of the conductive blocks adheres to the adhesion layer of each pad. The un-attached conductive blocks are removed, and the remaining conductive blocks become the conductive blocks for electrical connection.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
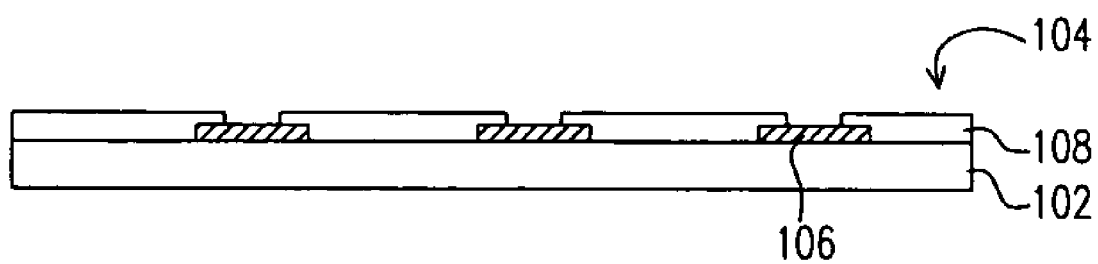
FIGS. 1A through 1F are schematic cross-sectional views showing a process for mounting conductive blocks according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic cross-sectional views showing a process for mounting conductive blocks according to one preferred embodiment of this invention. As shown in FIG. 1A, a substrate 102, such as a IC chip, a wafer, a carrier, or a PCB, with a surface 104 having a plurality of pads 106 thereon is provided. A protective layer 108, such as a passivation layer or a solder mask, is optionally formed on the surface 104 of the substrate 102 such that at least a portion of the pads 106 is exposed.

Figure 1B:
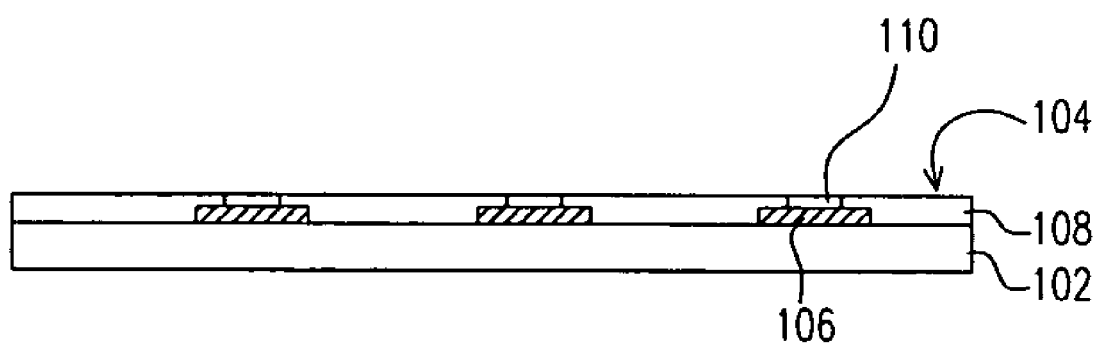

As shown in FIG. 1B, an adhesive layer 110 is formed on the exposed surface of each pads 106. The adhesive layer 110 as a sticky film is preferably comprised of a material that has gluing properties at room temperature, examples of such materials include, but not limited to, an organic surface preservation (OSP) or a flux. Furthermore, the method of forming the adhesive layers 110 on the pads respectively includes dipping.

Figure 1C:
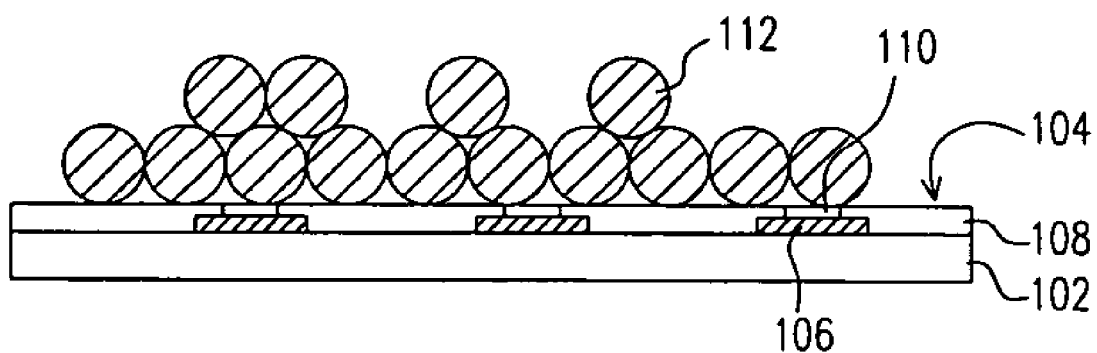

As shown in FIG. 1C, a large number of conductive blocks 112 is scattered over the surface 104 of the substrate 102 so that the conductive blocks 112 are roughly evenly distributed over the surface 104. In this embodiment, the conductive blocks 112 are fabricated from a solder material, for example.

Figure 1D:
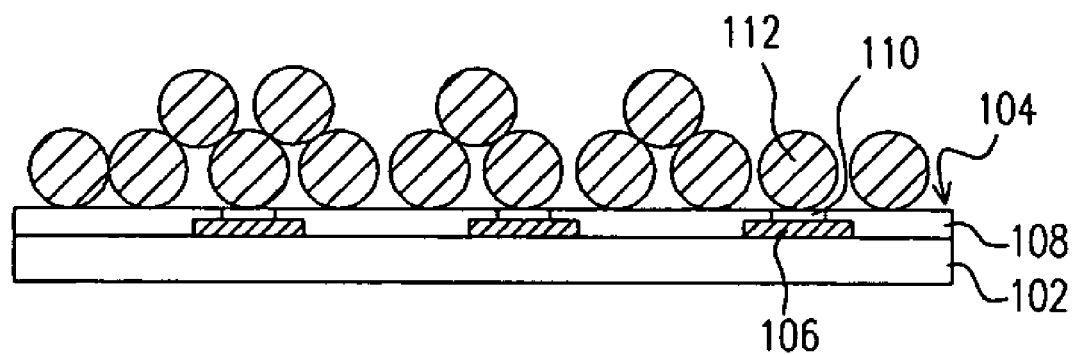

As shown in FIG. 1D, the conductive blocks 112 are vibrated mechanically using an instrument such as an ultrasonic vibrator. The vibration moves the loose conductive blocks 112 on the surface 104 of the substrate 102. With the conductive blocks 112 set into motion on the surface 104, one conductive block 112 will eventually adhere to each adhesive layer 110 as the area of each adhesion layer 110 is designed to catch only one conductive block 112.

Figure 1E:
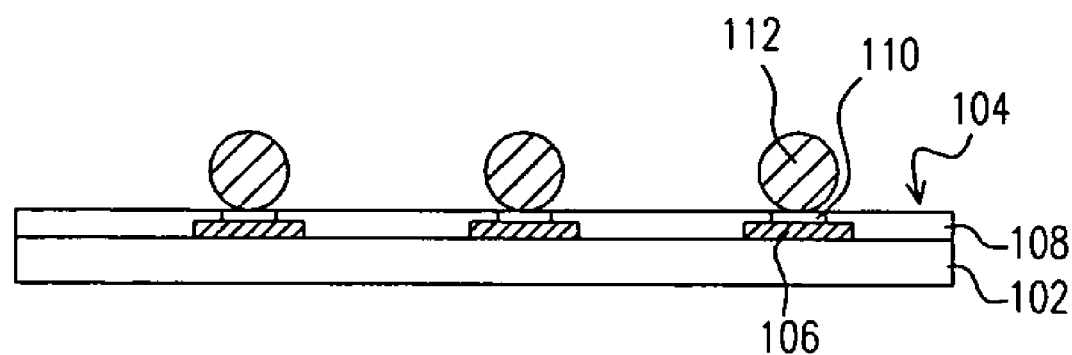

As shown in FIG. 1E, a vacuum suction process can be used to remove all the non-attached conductive blocks 112 from the surface of the substrate 102. The conductive blocks 112 remain on the adhesive layers 110 respectively.

Figure 1F:
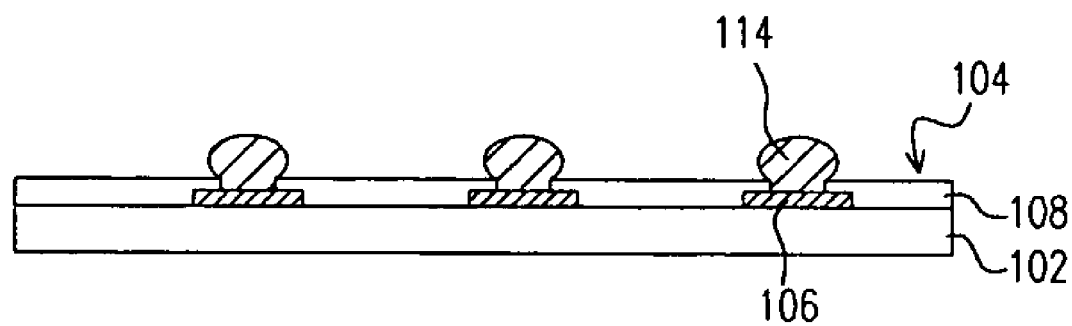

As shown in FIG. 1F, a reflow process is performed in this embodiment. During the reflow operation, the conductive blocks 112 shown in FIG. 1E are firmly bonded to the respective pads 106 while the adhesive layers 110 may disappear or reaction with the conductive blocks 112. Ultimately, the conductive blocks 112 shown in FIG. 1E become a plurality of conductive blocks 114 for electrical connection between the substrate 102 and other component. Furthermore, during the reflow operation, a coining process may be carried out to planarize the top end of the conductive blocks 114 so as to improve the degree of co-planarity of the conductive blocks 114.

Figure 2A:
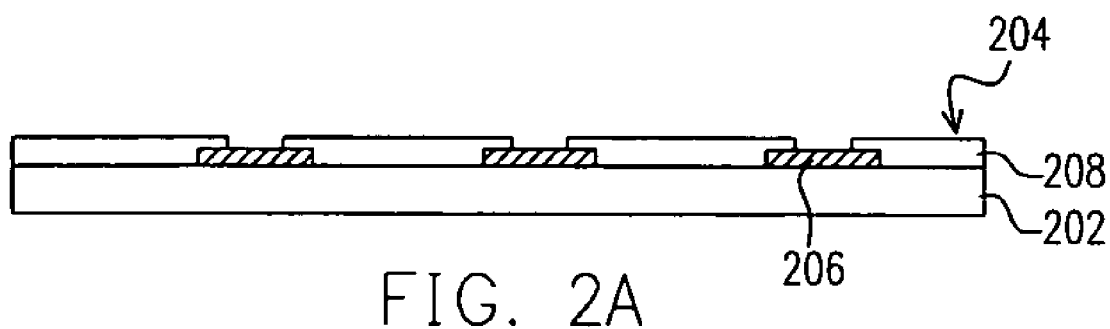
FIGS. 2A through 2E are schematic cross-sectional views showing a process for mounting conductive blocks according to another preferred embodiment of this invention.

FIGS. 2A through 2E are schematic cross-sectional views showing a process for mounting conductive blocks according to another preferred embodiment of this invention. As shown in FIG. 2A, a substrate 202, such as an IC chip, a wafer, a carrier, or a PCB, with a surface 204 having a plurality of pads 206 thereon is provided. A protective layer 208, such as a passivation layer or a solder mask, is optionally formed on the surface 204 of the substrate 202, wherein at least a portion of the pads 206 is exposed.

Figure 2B:
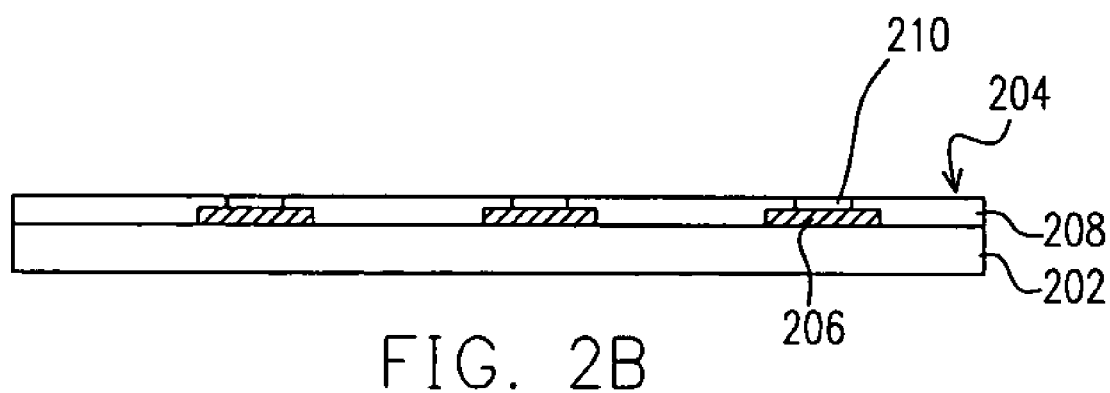

As shown in FIG. 2B, an adhesive layer 210 is formed on the exposed surface of the pads 206. The adhesive layer 210 is preferably comprised of a material that has gluing properties at soldering temperature including, for example, a solder material, a low melting point metal or a low melting point alloy. Furthermore, the method of forming the adhesive layers 210 on the pads respectively includes dipping.

Figure 2C:
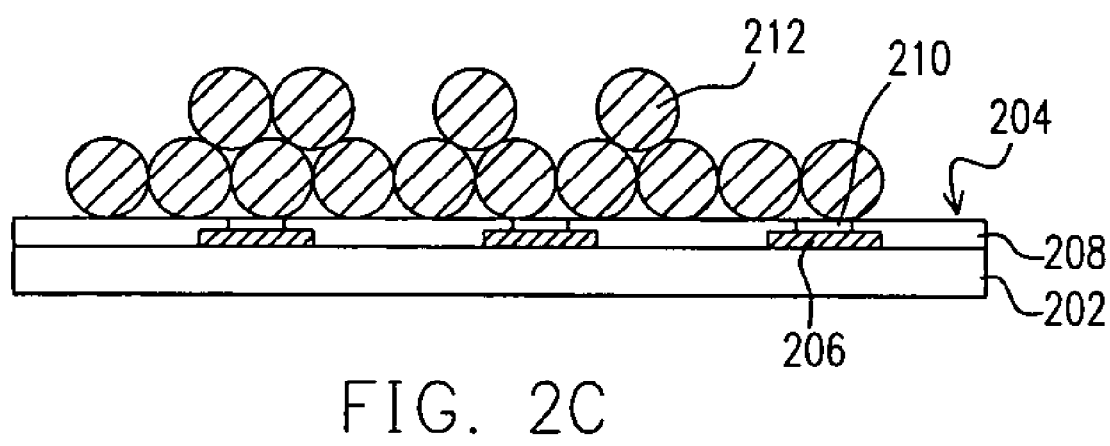

As shown in FIG. 2C, a large number of conductive blocks 212 is scattered over the surface 204 of the substrate 202 so that the conductive blocks 212 are roughly evenly distributed over the surface 204. In this embodiment, the conductive blocks 212 are comprised of a high melting point metal or a high melting point alloy, for example. Specifically, these conductive blocks 212 have a melting point higher than the adhesive layer 210.

Figure 2D:
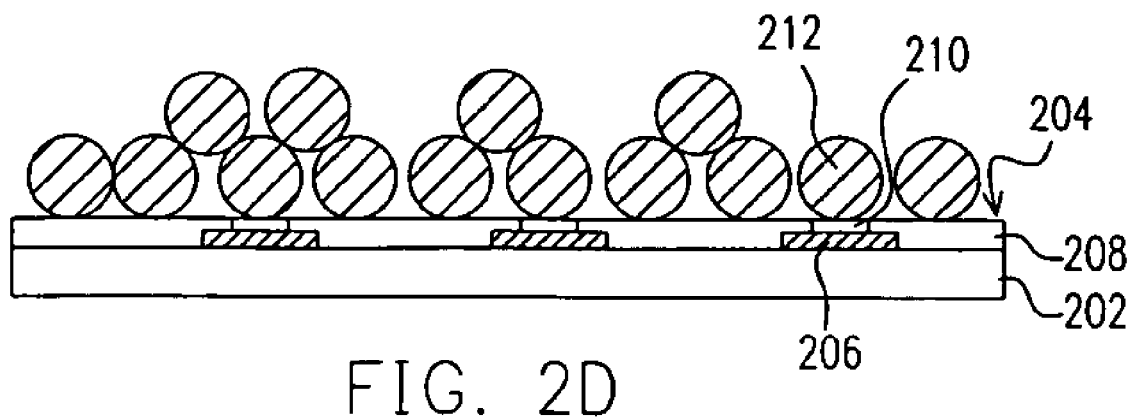

As shown in FIG. 2D, the conductive blocks 212 are vibrated mechanically using an instrument such as an ultrasonic vibrator. The vibration moves the loose conductive blocks 212 on the surface 204 of the substrate 202. In the meantime, a reflow process is carried out on the adhesive layers 210 so that the adhesive layers 210 melt under the soldering temperature. However, the conductive blocks 212 remain in a solid state due to its higher melting point. The melted adhesion layers 210 have great cohesive strength with the solid conductive blocks 212. Hence, after the reflow process, one of the conductive blocks 212 will be attached to the adhesion layer 210 on each pad 206. In other words, the conductive blocks 212 are respectively connected to pads 206 via the adhesion layers 210.

Figure 2E:
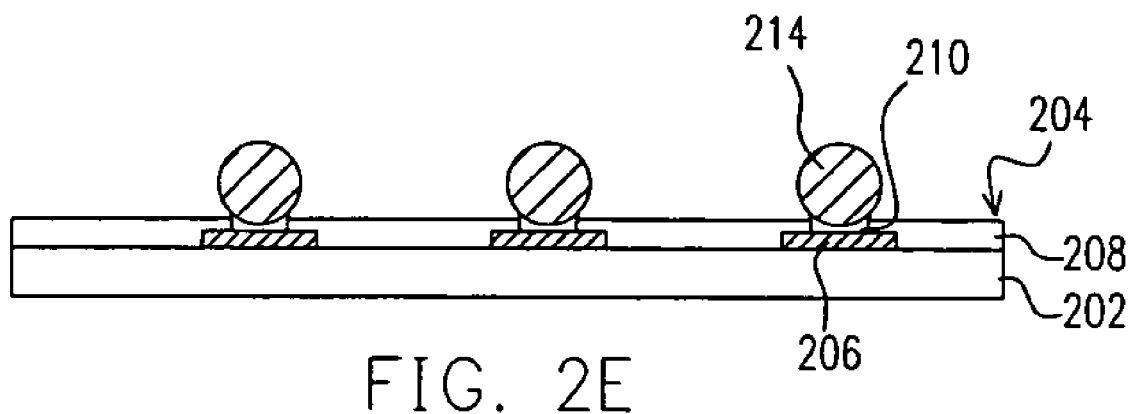

As shown in FIG. 2E, a vacuum suction process can be used to remove all the non-attached conductive blocks 212 from the surface of the substrate 202. The conductive blocks 212 remain on the adhesive layers 210. Ultimately, the conductive blocks 212 shown in FIG. 2D become a plurality of conductive blocks 214 for electric interconnection between the substrate 202 and other component.

In the first embodiment of this invention, solder conductive blocks are formed on the surface of a substrate. An adhesive material (for example, OSP or flux) with adhesive properties at the room temperature is used to make a plurality of adhesive layers on pads of the substrate, and each adhesive layer positions and attaches one of the conductive blocks to each pad. Therefore, the attachment between the blocks and the pads occurs at the room temperature.

Similarly, in the second embodiment of this invention, metal conductive blocks are formed on the surface of a substrate. The conductive blocks are fabricated by using a high melting point metal (or a high melting point alloy). Using an adhesive material (for example, a solder material) having adhesive properties at the soldering temperature, and having a melting point lower than the conductive blocks to form an adhesive layer on each pad of the substrate, the conductive blocks are positioned and attached to the adhesive layers respectively when the temperature is raised to the melting point temperature of the adhesive layers. Therefore, the attachment between the blocks and the pads occurs at the soldering temperature of the adhesive layers.

In summary, according to the invention, conductive blocks are for fabricated on a surface of a substrate. It should be noted that the substrate could be an IC chip, a wafer, a chip carrier, or a PCB. If the substrate is an IC chip (or a wafer), the conductive blocks can connect the substrate, i.e. the IC chip, to an external component, such as an IC package carrier or a PCB. If the substrate is a chip carrier, the conductive blocks can connect the substrate, i.e. the chip carrier, to an external component such as an IC chip or a PCB. If the substrate is a PCB, the conductive blocks can connect the substrate, i.e. the PCB, to an external component such as an IC chip or a chip carrier. Therefore, the invention can be used in the fields of electric package such as flip chip interconnection technology, BGA interconnection technology, direct chip attach (DCA) interconnection technology, etc.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for mounting a plurality of conductive blocks on a surface of a substrate, wherein the substrate has a plurality of pads on the surface thereof, the process at least comprising the steps of:
    (a) forming an adhesive layer over each of the pads;
    (b) scattering a plurality of conductive blocks on the surface of the substrate;
    (c) vibrating the conductive blocks such that one of the conductive blocks is attached to the adhesive layer on each pad; and
    (d) removing the un-attached conductive blocks.

2. The process of claim 1, wherein the step (c) is performed by using an ultrasonic vibrator.

3. The process of claim 1, wherein the conductive blocks is comprised of a solder material.

4. The process of claim 3, wherein after the step (d) further comprises a step (d1) of performing a reflow process to soften the conductive blocks.

5. The process of claim 3, wherein the adhesive layer comprises a flux material.

6. The process of claim 1, wherein the adhesive layer is comprised of a solder material and the melting point of the conductive blocks is higher than the melting point of the adhesive layer.

7. The process of claim 6, wherein the step (c) further comprises performing a reflow process to melt the adhesive layer such that one of the conductive blocks adheres to the adhesive layer on each pad.

8. The process of claim 1, wherein the step (d) is performed by a vacuum suction operation.

9. The process of claim 1, wherein the substrate is an IC chip.

10. The process of claim 1, wherein the substrate is a wafer.

11. The process of claim 1, wherein the substrate is an IC package carrier.

12. The process of claim 1, wherein the substrate is a PCB.

13. A process for mounting a plurality of conductive blocks on a surface of a substrate, wherein the substrate has a plurality of pads on the surface thereof, the process at least comprising the steps of:
   (a) forming an sticky layer over each of the pads;
   (b) scattering a plurality of solder blocks on the surface of the substrate;
   (c) vibrating the solder blocks such that only one of the solder blocks is attached to the sticky layer on each pad;
   (d) removing the un-attached solder blocks; and
   (e) performing a reflow process to bond the solder blocks firmly to the pads respectively, and the remaining solder blocks becomes the conductive blocks.

14. The process of claim 13, wherein the step (c) is performed by using an ultrasonic vibrator.

15. The process of claim 13, wherein the sticky film comprises a flux material.

16. The process of claim 13, wherein the step (d) is performed by a vacuum suction operation.

17. The process of claim 13, wherein the substrate is an IC chip, a wafer, an IC package carrier, or a PCB.

18. A process for mounting a plurality of conductive blocks on a surface of a substrate, wherein the substrate has a plurality of pads on the surface thereof, the process at least comprising the steps of:
   (a) forming a solder layer over each of the pads;
   (b) scattering a plurality of conductive blocks on the surface of the substrate, wherein the melting point of the conductive blocks is higher than the melting point of the solder layers;
   (c) performing a reflow process and vibrating the conductive blocks such that only one of the conductive blocks is attached to the solder layer on each pad; and
   (d) removing the un-attached conductive blocks, and the remaining conductive blocks becomes the conductive blocks.

19. The process of claim 18, wherein the step (c) is performed by using an ultrasonic vibrator.

20. The process of claim 18, wherein the step (d) is performed by a vacuum suction operation.

21. The process of claim 18, wherein the substrate is an IC chip, a wafer, an IC package carrier, or a PCB.

* * * * *